United States Patent

Arnold et al.

Patent Number: 5,224,202
Date of Patent: Jun. 29, 1993

[54] APPARATUS FOR THE EVAPORATION OF LIQUIDS

[75] Inventors: Manfred Arnold, Aschaffenburg; Rainer Gegenwart, Rödermark; Sonja Noll, Frankfurt; Jochen Ritter, Laubach; Helmut Stoll, Sulzbach, all of Fed. Rep. of Germany

[73] Assignee: Leybold Aktiengesellschaft, Hanau I, Fed. Rep. of Germany

[21] Appl. No.: 762,932

[22] Filed: Sep. 19, 1991

[30] Foreign Application Priority Data

Jul. 19, 1991 [DE] Fed. Rep. of Germany ....... 4124018

[51] Int. Cl.$^5$ .............................................. C23C 14/26
[52] U.S. Cl. .................................... 392/399; 392/395; 392/389
[58] Field of Search ............... 392/388, 389, 394, 395, 392/399; 118/725, 726

[56] References Cited

U.S. PATENT DOCUMENTS

| | | | |
|---|---|---|---|
| 809,839 | 1/1906 | Payne | 392/399 |
| 2,219,522 | 10/1940 | Hinsch | 392/399 |
| 2,426,939 | 9/1947 | Libman | 392/399 |
| 2,772,318 | 11/1956 | Holland | 118/726 |
| 2,920,179 | 1/1960 | Shaw | 392/399 |
| 3,350,219 | 10/1967 | Shaler | 118/726 |
| 3,786,231 | 1/1974 | Torvfelt | 392/394 |
| 4,349,723 | 9/1982 | Swiatosz | 392/399 |

Primary Examiner—Teresa J. Walberg
Attorney, Agent, or Firm—Felfe & Lynch

[57] ABSTRACT

A heated evaporator housing is provided at its inlet with an ultrasonic atomizer for reducing monomer to small droplets and a permeable porous body completely occupying a cross section of the housing between the inlet and the outlet. A vacuum pump and a reaction chamber for coating substrates are provided downstream of the outlet.

9 Claims, 1 Drawing Sheet

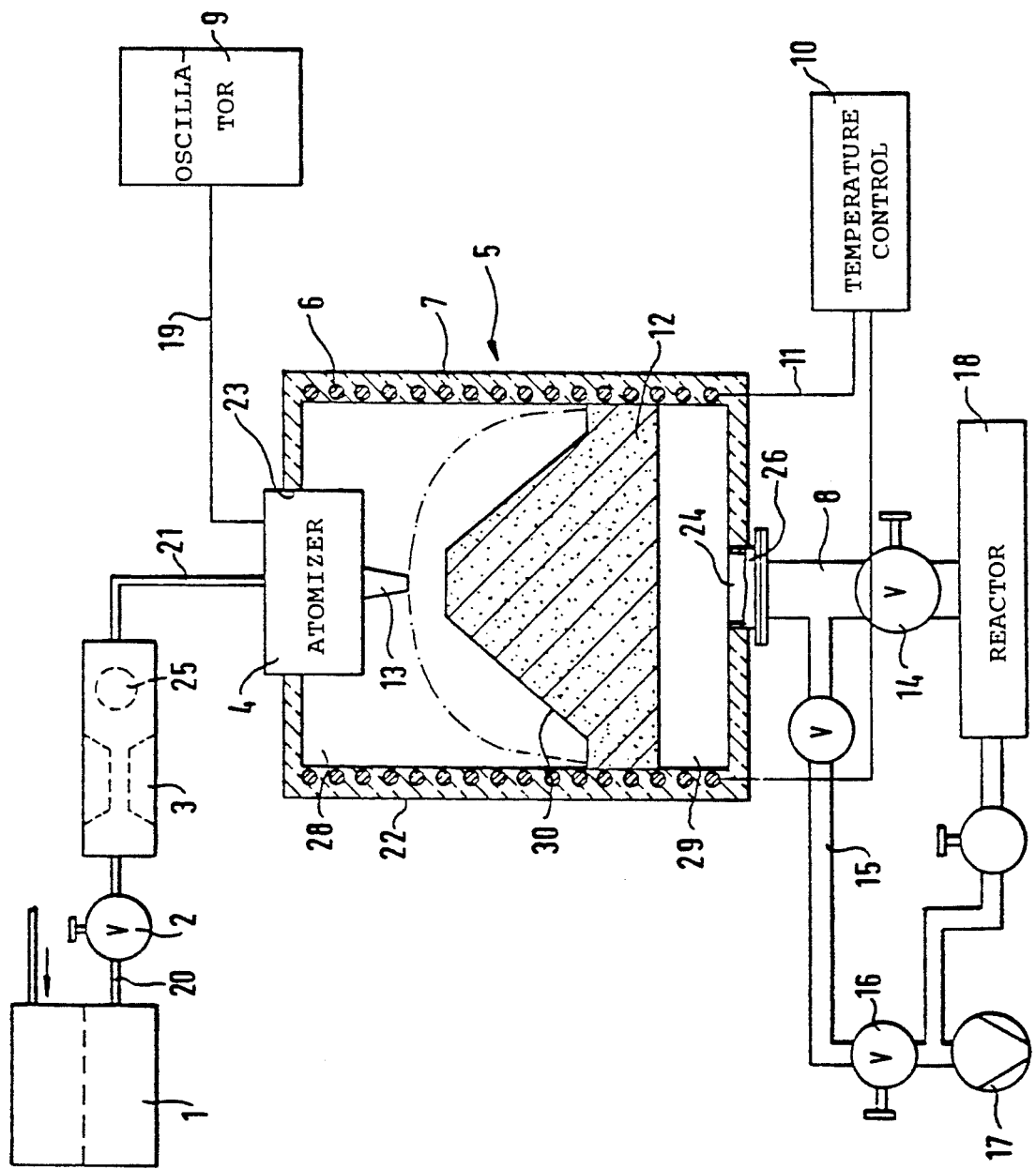

APPARATUS FOR THE EVAPORATION OF LIQUIDS

BACKGROUND OF THE INVENTION

The invention relates to an apparatus for the evaporation of liquids, especially monomers containing silicon, for the production of thin coatings containing silicon and/or silicon compounds by chemical vapor deposition (CVD) in a vacuum onto substrates, using a current adjusting device and an evaporator connected to the output of the latter.

In the fields of microelectronics, display technology and telemetering, thin coatings of $SiO_2$, $Si_3N_4$, a-C:H, and a-Si:C, among others, are employed. In the prior art the coatings are produced by the low-pressure CVD or plasma-enhanced CVD process. A great variety of gases are used as starting materials for these coatings; for example, $SiH_4$ (silane) can be used. For a number of applications compounds are suitable which first must be converted to the gaseous phase, since they are liquid at room temperature and have a low vapor pressure. Examples are TEOS=tetraethoxysilane, or HMDS=hexamethyldisilane. In order to produce the said coatings repeatably with these liquids converted to the gaseous phase an absolutely constant, repeatable and controllable gas flow is necessary. For this purpose an inert carrier gas, Ar, He or $N_2$ can be passed through the liquid compound in a known manner. The carrier gas becomes saturated with the compound by diffusion, so that it can then enter the reactor. The regulation needed for this purpose is accomplished by temperature control and carrier gas control. A disadvantage of this method is the ever present large amount of carrier gas which, of course, is also carried into the reactor and interferes with the process or reduces the process window. Moreover, a very precise and difficult temperature control is necessary, since the loading of the carrier gas depends directly on the temperature.

It is furthermore known to hold the liquid compound in a heated tank. The vapor over the fluid is likewise fed through a heated liquid controller into a reactor. The heating of the liquid controller is likewise very difficult.

An apparatus as well as a method of the kind described above is known (U.S. Pat. No. 4,947,789) which serves for the evaporation of monomers that are liquid at room temperature. For the production of thin coatings containing silicon and oxygen, chemical vapor deposition is used for this purpose. It is furthermore known to use a mass flow controller as the flow adjusting apparatus, wherein the monomer pumped by the latter is fed in liquid state to the evaporator. In this known method the reacted rate of flow is greatly limited, since at high flow rates of over 25 g/h a stable flow can no longer be produced. For this reason no reliable practice of the is possible by the known method.

The invention is addressed to creating an apparatus whereby perfect evaporation of the liquid is achieved in a simple and rapid manner.

The housing of the evaporator has an evaporator body whose surface is roughened, porous, or whose body is made at least partially permeable. In this manner the total surface area of the evaporator is increased in a simple manner and thus the time required for evaporating the liquid is substantially reduced. For this purpose it is advantageous that the surface area of the liquid to be evaporated is increased by atomizing it and thus the mass-flow rate at constant vapor pressure and a given temperature increases, and that the evaporator body is provided between the ultrasonic atomizer and the outlet opening of the housing and the ultrasonic atomizer is equipped with a diaphragm which is made to vibrate by means of an oscillator at medium frequency, or at another suitable frequency corresponding to the liquid. In this manner the liquid provided in a supply tank can be metered to the ultrasonic atomizer through a flow controlling system or metering device. The liquid stream which passes through the nozzle of the ultrasonic atomizer is broken up by the vibrations of the diaphragm into a great number of small droplets of the order of magnitude between 50 and 100 $\mu$m. These droplets strike against the evaporator body provided in the housing of the evaporator so that a vaporization of the liquid is accomplished very quickly.

It is furthermore advantageous that the evaporator body divides the housing of the evaporator into an inlet space and an outlet space such that the liquid passes from the inlet space to the outlet space only through the evaporator body.

The evaporator body preferably occupies entire cross-sectional area of the housing of the evaporator.

The evaporator body can be made of a sintered material. In this manner a very great surface area is created in a simple manner without increasing the bulk of the evaporator body.

The evaporator body can be of a truncated pyramidal shape.

The housing of the evaporator body and/or the interior are preferably heated by means of a heating system which is in a working connection with a temperature control system.

The production of many small droplets is of great advantage, because this is a simple way to increase the surface area of the liquid. The evaporator body made of sintered metal makes the flow of liquid or vapor uniform.

BRIEF DESCRIPTION OF THE DRAWING

The sole FIG. is a diagrammatic representation of the evaporation apparatus.

DETAILED DESCRIPTION OF THE PREFERRED EMBODIMENT

A supply tank 1 is connected by a supply line 20 to a liquid controller 3. Between the supply tank 1 and the liquid controller and flow control system 3 there is a shut-off valve 2 so that the supply tank 1 can be disconnected if necessary.

The liquid controller 3 is connected by another supply line 21 to an evaporator 5. The liquid controller 3 can be connected to a control system not represented in the drawing, which controls the feed of liquid from the supply tank.

The evaporator 5 consists of a housing 22 which has in one area an inlet opening 23 and in another area an outlet opening 24.

The evaporator 5 is surrounded by a heating coil 6 which holds the evaporator 5 at the necessary working temperature.

Furthermore, the evaporator and with it the heating coil 6 is surrounded entirely by insulation 7. Advantageously the heater is connected by an electrical line 11 to a temperature control system 10 so that the heating can be regulated between a temperature of, for example 50° C. to 200° C.

In the inlet opening 23 is the ultrasonic atomizer 4, which is connected by an electrical line 19 to an oscillator 9 which sets in vibration a diaphragm, not represented in the drawing, of the ultrasonic atomizer 4.

In the bottom part of the housing 22 is the outlet opening 24 in which an outlet connection 26 is provided, which is connected by a line 8 and an adjustable valve 14 to the reactor 18 of the pieces to be coated, which is represented only diagrammatically in the drawing.

Within the housing 22 of the evaporator 5 is an evaporator body 12, which consists of a porous material so that a very great surface area is obtained. Advantageously, the evaporator body 12 can consist of a sintered material, especially sintered bronze, which can have a pore width between 1 and 200 μm. Any other material can be used which provides a large surface area by the nature of its surface.

The method according to the invention for the deposit of Si and/or Si-containing compounds and the apparatus that can be used for that purpose are described below.

First a liquid is put into the supply tank 1, and then an inert gas such as Ar, He, or $N_2$, for example, is let into the supply tank 1, placing a pressure of, for example, 1 bar on the liquid. The liquid is then fed through line 20 and the liquid controller or metering device 3 to the ultrasonic atomizer 4. The ultrasonic atomizer 4 is equipped with a nozzle 13 which has a diaphragm (not shown) which is made to vibrate at a medium frequency by means of the oscillator 9. In this manner, the liquid stream which is fed through the nozzle 13 is made to vibrate and broken up into a great number of small droplets of the order of magnitude between 50 and 100 μm. A great number of small droplets form a relatively great surface area for the same volume, i.e., the greater the number of drops that can be formed, the greater becomes the surface of the liquid. The surface of the liquid is very critical to the thermal transfer and thus also for the evaporation of the liquid. This appears from the formula:

$$Q = k A (T_v - T_t)$$

In this formula,
 $Q$ = heat flow in KJ/s
 $k$ = thermal transfer coefficient (W/m² K)
 $T_v$ = evaporator temperature
 $T_t$ = droplet temperature Since a small droplet evaporates more quickly than a large one it is possible in this manner to very greatly reduce the time needed for the evaporation of the liquid. Also, by means of the atomization a constant flow of liquid is obtained. This appears from the following formula:

$$t = d^3 h_v / (6 Q)$$

$t$ = time
 $d$ = droplet diameter
   = density
 $h_v$ = heat of evaporation

By the use of ultrasonic atomizers of different configuration and sizes and different sizes of evaporators any desired rate of flow can be set.

The liquid atomized by the ultrasonic atomizer 4 arrives, at the evaporator body 12, which produces the evaporation of the liquid not yet evaporated. Since the temperature prevailing in the housing 22 is greatly reduced by the evaporation it is advantageous if the evaporator 5 as a whole is heated by means of the heater 6.

In this process the temperature control is performed by means of the temperature regulating system which is in working relationship with the electrical heater 6. This assures that the heat is provided to the evaporator body 12 through the housing wall. Furthermore, it is also possible to provide a heater in the interior of the housing 22 of the heat exchanger 4.

Through the method according to the invention and the corresponding apparatus a very uniform, rapid evaporation in a vacuum is obtained without the occurrence of pressure fluctuations or shock pressures due to effects of ebullition.

The housing 22 for the accommodation of the evaporator body 12 is connected by the line 8 connected to the outlet connection 26 and through an adjustable valve 14 to the reactor 18, and by another line 15 and a second valve 16 to a vacuum pump 17. In order to assure that the liquid will reach the reactor 18 from the supply tank 1 only through the evaporator body, the evaporator body 12 of the housing 22 is divided into two sections, namely into an inlet chamber 28 and an outlet chamber 29, which are completely separated by the evaporator body 12.

The evaporator body 12 is preferably permeable such that the liquid can pass from the inlet chamber 28 to the outlet chamber 29. In this manner a relatively great surface area is obtained on the evaporator body 12 with simple constructional means. Furthermore, the evaporator body 12 can be configured in the shape of a truncated pyramid, a cone or a roof.

We claim:

1. Apparatus for the evaporation of monomers comprising
   an evaporator housing having an inlet, an atomizer for supplying atomized monomer at said inlet,
   an outlet for discharging evaporated monomer from said housing, said outlet being opposite from said inlet, and
   a porous body in said housing between said inlet and said outlet.

2. Apparatus as in claim 1 wherein said porous body completely occupies a cross section of said housing between said inlet and said outlet, said body being permeable so that said monomer passes from said inlet to said outlet only through said porous body.

3. Apparatus as in claim 1 wherein said atomizer is an ultrasonic atomizer.

4. Apparatus as in claim 1 further comprising heating means for heating said housing.

5. Apparatus as in claim 1 wherein said porous body consists of a sintered material having a pore width between 1 μm and 200 μm.

6. Apparatus as in claim 1 further comprising a vacuum pump connected to said outlet.

7. Apparatus as in claim 1 wherein said porous body has a convex surface facing said inlet.

8. Apparatus as in claim 7 wherein said convex surface is pyramidal.

9. Apparatus as in claim 7 wherein said convex surface is conical.

* * * * *